United States Patent [19]

Pelley

[11] 4,024,463

[45] May 17, 1977

[54] A.C. AMPLIFIER AUTOMATIC GAIN CONTROL FAST ATTACK CIRCUIT

[75] Inventor: Arlo D. Pelley, Marion, Iowa

[73] Assignee: Rockwell International Corporation, El Segundo, Calif.

[22] Filed: May 3, 1976

[21] Appl. No.: 682,288

[52] U.S. Cl. .............................. 330/138; 330/139; 330/140; 330/141

[51] Int. Cl.² ........................................ H03G 3/20

[58] Field of Search ............ 330/29, 140, 141, 134, 330/138, 139; 325/319, 404, 410, 412

[56] References Cited

UNITED STATES PATENTS 3,230,458  1/1966  Stangeland ..................... 325/410
3,620,631  11/1971  Stopica et al. ..................... 325/404

*Primary Examiner*—James B. Mullins
*Attorney, Agent, or Firm*—Howard R. Greenberg; Robert J. Crawford

[57] ABSTRACT

A fast-attack circuit is employed in an A.C. amplifier automatic gain control circuit to temporarily apply a D.C. gain control signal immediately to the amplifier circuit in response to a sudden signal increase in excess of a predetermined threshold level to avoid the problems of over-attack and pinch-down which might otherwise arise during the period required for the AGC loop to achieve stabilized control following the inception of the signal increase.

8 Claims, 1 Drawing Figure

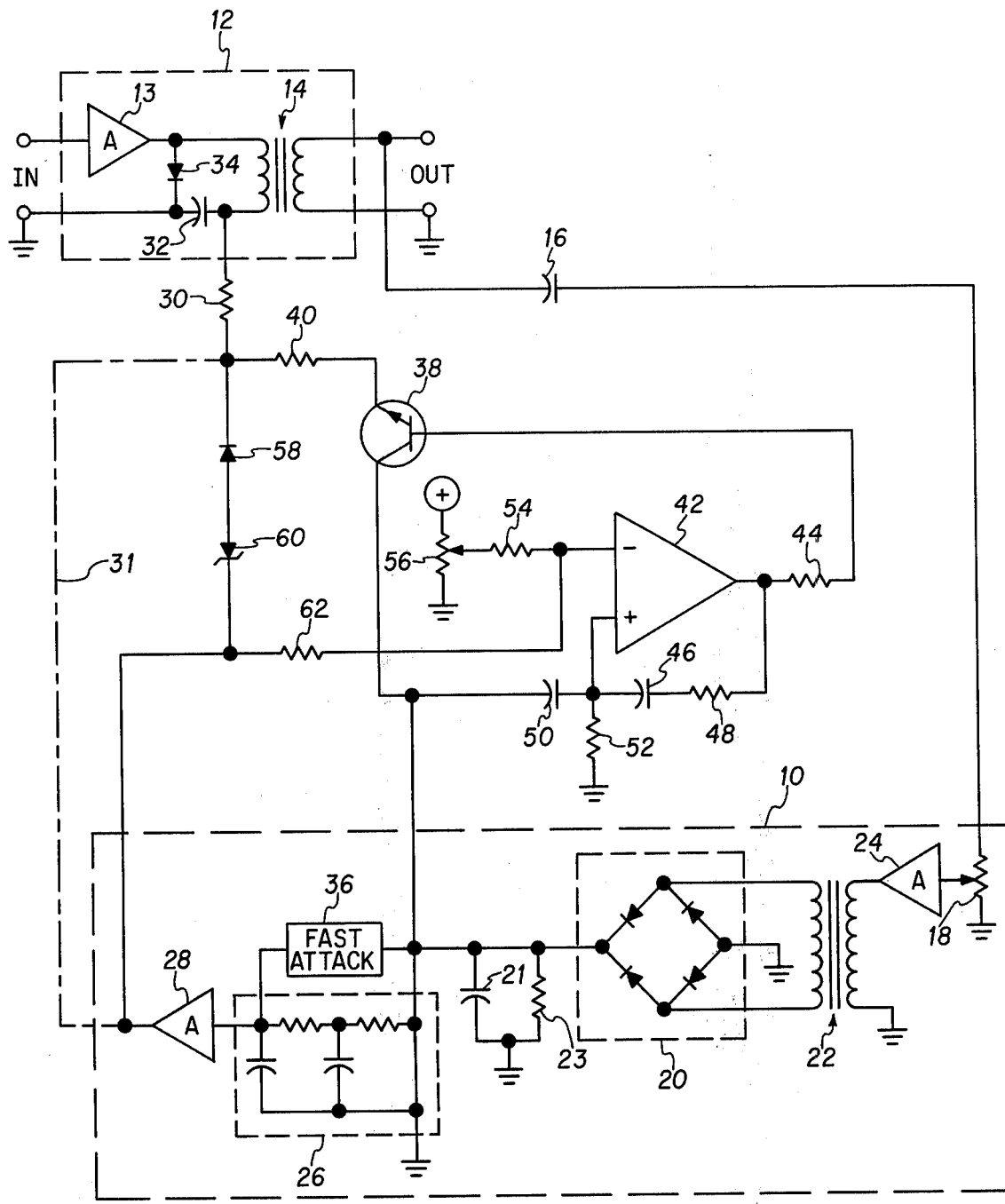

A.C. AMPLIFIER AUTOMATIC GAIN CONTROL FAST ATTACK CIRCUIT

The government has rights in this invention pursuant to contract number F19628-70C-0218 awarded by the Department of the Air Force.

BACKGROUND OF THE INVENTION

The present invention pertains generally to automatic gain control circuits used in conjunction with A.C. amplifier circuits and particularly to a fast-attack circuit which may be employed to avoid problems of overattack and pinch-down.

Although automatic gain control (AGC) circuits commonly used in conjunction with A.C. amplifier circuits to compensate for varying input signal levels are capable of tracking minor signal variations to provide a continuous gain control signal, sudden large signal variations require special handling. For example, in order to improve response time for rapidly attenuating a sudden large signal increase, AGC circuits commonly employ fast-attack circuits for offsetting the delay introduced into the gain control signal by the low-pass filter that is normally required in the gain control loop to minimize harmonic and intermodulation distortion. A typical prior art fast-attack circuit is described in U. S. Pat. No. 3,620,631 entitled "Gain Control Amplifier" which provides an ancillary path for rapidly charging the capacitors in the low-pass filter through a low impedance path in response to signal increases which exceed some predetermined threshold level. Although this circuit and others like it permit quickly stabilizing the AGC control loop (bringing the amplifier circuit output close to its steady state value), during the interim from the inception of the signal increase until the time that the capacitors are sufficiently charged so as to provide an efficacious gain control signal no means are provided for attenuating the output of the amplifier circuit in order to avoid the signal "blast" which results. When this signal "blast" (unattenuated signal) is reflected at the output of the AGC circuit low-pass filter after some finite delay (which is present even with the inclusion of prior art fast-attack circuits), it provides a gain control signal which results in over-attack, viz. a signal which compensates more than necessary so as to reduce the amplifier circuit output to a level that is lower than desired under stablized operation (the output properly attenuated). This lower level is commonly referred to as pinch-down. Although the amplifier output signal will eventually settle back to the desired level, time is expended in doing so during which information may not properly be detected because of the reduced amplitude level.

With the foregoing in mind, it is a primary object of the present invention to provide a new and improved fast-attack circuit for use with automatic gain control circuits.

It is a further object of the present invention to provide such a circuit which obviates over-attack problems encountered heretofore and the pinch-down effect associated therewith.

The foregoing objects as well as others and the means by which they are achieved through the present invention may best be appreciated by referring to the Detailed Description of the Preferred Embodiment which follows hereinafter together with the single appended drawing FIGURE which is a schematic depiction of the invention in use.

BRIEF DESCRIPTION OF THE INVENTION

In accordance with the stated objects, the fast-attack circuit of the invention comprises a switching means for temporarily applying the output of the conventional D.C. signal detector in an AGC loop directly to the amplifier circuit immediately upon detecting a D.C. signal which exceeds some predetermined threshold level, thereby eliminating any possibility of a signal blast. The switching means is enabled to so apply the D.C. signal directly to the amplifier for a predetermined period of time sufficient to allow the low-pass filter of the AGC loop and its associated circuitry to reflect the D.C. signal increase at its output upon achieving stabilized operation. In its preferred embodiment, the means for establishing the duration of the enable signal is an opertional amplifier arranged to function as a one-shot multivibrator.

DETAILED DESCRIPTION OF THE PREFERRED EMBODIMENT

As shown in the attached drawing, reference numeral 10 represents a typical AGC circuit which is described in detail in U.S. Pat. No. 3,620,631, previously alluded to, for controlling the gain of an amplifier circuit 12. The input signal to amplifier circuit 12, after passing through amplifier 13 thereof, is attenuated at its output in accordance with th gain control signal applied thereto. Briefly, the A.C. signal output of amplifier cirucit 12 which appears across the secondary winding of an output transformer 14 is applied via a D.C. blocking capacitor 16 to a potentiometer 18 of AGC circuit 10 that is used to establish the desired AGC threshold level of input signal which must be exceeded for AGC control to be executed. The output of potentiometer 18 is applied to a full-wave rectifying circuit 20 via a transformer 22 and amplifier 24, with the rectifying circuit 20 functioning as a D.C. detector (as it will be referred to hereinafter) to provide a D.C. output signal which is proportional to the A.C. output of amplifier circuit 12 and which is filtered by the parallel combination of capacitor 21 and resistor 23. The D.C. signal is applied to an RC low-pass filter 26 whose output is amplified by D.C. amplifier 28 and then applied as a gain control signal to the A.C. amplifier circuit 12 through a resistor 30 and a path 31 shown in phantom since the path no longer exists in the present invention. Because of the presence of capacitor 32 in series with the primary winding of output transformer 14, the D.C. AGC gain control signal passing through resistor 30 is applied via the primary winding to the anode of diode 34 to control its conduction and consequently its shunting effect across the primary winding for purposes of attenuating the signal level which can be developed therein. Consequently, as the D.C. signal increases in level in response to an increased A.C. output of amplifier circuit 12 greater attenuation is realized thus effectuating the AGC control function.

The typical AGC circuit 10 may also comprise a fast-attack circuit 36, which as described in detail in the aforementioned U.S. Pat. serves to rapidly charge the capacitors of low-pass filter 26 in response to sudden large signal increases in order to avoid the inherent signal delay therein for quickly stablizing the AGC loop for normal operation to provide an AGC control signal to attenuate the output of A.C. amplifier circuit 12.

AGC loop stabilization is employed herein to connote the attainment of AGC loop operation wherein the output of ampliier circuit 12 is at or very close to its steady state value following some variation in the input signal. The period for stabilization may easily be determined by applying a constant input signal which exceeds the AGC threshold level and measuring the time for the output to achieve a constant value. Despite its presence in the AGC circuit 10, fast-attack circuit 36 does not obviate the over-attack problem caused by the presence of a signal "blast" during the finite period between the inception of a sudden large signal increase and the time that the capacitors of low-pass filter 26 are sufficiently charged so as to produce a sufficient AGC control signal for effectuating the AGC control function (which can ordinarily be in the order of milliseconds). Once stabilized AGC operation has been achieved (with or witout prior art fast-attack circuitry), the output of amplifier circuit 12 will be at a level that is predicated on that level being reflected at the output of D.C. amplifier 28 in AGC circuit 10. However, until the signal "blast" caused by a sudden signal increase has had time to be reflected at the output of amplifier 28 so as to participate attenuation therein, the signal "blast" is present and detectable. Once the "blast" finally appears at the output of amplifier 28, delayed in time by low-pass filter 26 even with fast-attack circuit 36, its magnitude (which of course will be greater than the final magnitude achieved after the A.C. output of amplifier circuit 12 has been attenuated in response to AGC operation) will over-attenuate the output of A.C. amplifier circuit 12 causing over-attack and resulting in the pinch-down effect (signal lower than desired). Eventually, the AGC loop will achieve stabilized operation so that the output of D.C. amplifier 28 properly tracks the output of amplifier circuit 12, but only after the unstable period intermediate the inception of the sudden signal increase and the charging of the capacitors in low-pass filter 26. During this period, the overcompensated decrease in amplifier gain can result in low level signals such that desired information cannot be properly detected.

The foregoing problem is overcome through the present invention by temporarily applying the D.C. signal output of detector 20 immediately to A.C. amplifier circuit 12 when it exceeds some predetermined threshold level, thereby effectuating immediate AGC control. The D.C. signal is applied for a priod of time sufficient to allow the AGC circuit to assume stabilized operation by virtue of the charging of the capacitors in low-pass filter 26. At that time, the AGC circuit 10 is allowed to assume normal control to the exclusion of the circuitry for directly applying the D.C. signal output of detector 20 to the A.C. amplifier circuit 12.

The D.C. signal is applied directly to A.C. amplifier circuit 12 through a transistor 38 whose collector-emitter path is connected between the output of detector 20 and resistor 30 via resistor 40. Transistor 38 is enabled to function as a closed switch by rendering it conductive through a forward bias enable signal applied to its base from the positive output pulse of an operational amplifier 42 via a current limiting resistor 44. It is to be noted that operational amplifier 42 is connected to function as a one-shot multivibrator, with its positive output pulse period determined by the time constant of capacitor 46 and resistor 48 which are connected in series between its output and its positive (+) input terminal. Its positive input is connected to the D.C. detector output 20 through a capacitor 50 and to ground through resistor 52 with these two elements serving as a differentiating circuit for differentiating the output of D.C. detector 20 to provide an efficacious pulse for triggering the operational amplifier 42 into conduction. The level at which the operational amplifier 42 is triggered into conduction before the AGC threshold level is exceeded is determined by the voltage applied through resistor 54 to its negative (−) input terminal from a potentiometer 56 which itself is connected between ground and a positive source of potential. Thus, any time that the voltage across resistor 52 exceeds the predetermined threshold level applied to the negative input terminal of operational amplifier 42, it will be triggered into conduction to provide a positive output pulse for rendering transistor 38 conductive during this pulse period. The period of duration may be set as long as desired with its limitation being determined by the amount of time necessary for the AGC circuit 10 to achieve stabilized operation.

The output of D.C. amplifier 28 is connected to the juncture of resistors 30 and 40 through a D.C. isolating diode 58 and a zener diode 60 which may be used to set the AGC threshold level which must be exceeded before its output can effectuate AGC control. If upon normal assumption of AGC control, it is desired to inhibit the application of D.C. signals directly to amplifier circuit 12 via transistor 38 for normal signal variations, then a resistor 62 may be connected between the output of D.C. amplifier 28 and the negative input of operational amplifier 42 to disable retriggering it, except for D.C. signal inreases which exceed the voltage applied to the operational amplifier 42 negative input terminal from the AGC gain control signal developed at the output of D.C. amplifier 28. Since normal AGC operation entails D.C. amplification, it may be readily appreciated that once the AGC threshold level has been exceeded, the predetermined threshold level for triggering operational amplifier 42 into conduction will be higher than the predetermined level voltage developed through resistor 54 prior to the input signal exceeding the AGC threshold level. If desired, the resistor 62 can also function to provide a turn-off signal for use with a bistable multivibrator (in lieu of the one-shot operational amplifier 42) whose enable period is not fixed in time, but is controlled as a function of the actual time necessary on an individualized basis for AGC circuit 10 to achieve stabilized operation.

It is thus seen that the disclosed invention provides a means for immediately effectuating AGC control of an A.C. amplifier circuit so as to eliminate signal blasts by immediately attenuating the signal as soon as it increases above a predetermined threshold level. Thus, this avoids over-attack and pinch-down problems without interfering with the normal stabilized AGC operation whether or not a prior art fast-attack circuit is employed. Since modifications of the detailed description which may not constitute departures from the scope and spirit of the invention may occur to those skilled in the art, the preferred embodiment herein is intended to be merely exemplary and not circumscriptive of the invention as it will now be claimed hereinbelow.

What is claimed is:

1. In combination with an A.C. amplifier circuit and an automatic gain control circuit having detector means for developing a D.C. signal proportional to the output amplitude of the amplifier circuit for controlling its output amplitude when the input signal thereto exceeds a predetermined AGC threshold level, a fast-attack circuit, comprising:

means for detecting a rise in the level of the D.C. signal and providing an output signal whose magnitude is proportional thereto;

control signal means for providing an enable signal whose duration is no greater than the stabilization period for the automatic gain control circuit in response to said output signal when its magnitude exceeds a predetermined threshold level, and switching means for applying the D.C. signal directly to the A.C. amplifier in response to the presence of said enable signal.

2. The fast-attack circuit of claim 1 wherein said detecting means is a differentiating circuit.

3. The fast-attack circuit of claim 1 wherein said control signal means comprises a one-shot multivibrator.

4. The fast-attack circuit of claim 1 including means for establishing a higher predetermined threshold level for said output signal when the amplifier circuit input signal exceeds the predetermined AGC threshold level than when it does not.

5. An A.C. amplifier automatic gain control circuit having a fast-attack means, comprising:

D.C. detector means for developing a D.C. signal proportional to the output amplitude of the amplifier circuit;

AGC control means for applying the D.C. signal to the amplifier circuit for controlling its output amplitude when the input signal thereto exceeds a predetermined AGC threshold level;

means for detecting a rise in the level of the D.C. signal and providing an output signal whose magnitude is proportional thereto;

control signal means for providing an enable signal whose duration is no greater than the stabilization period for the automatic gain control circuit in response to said output signal when its magnitude exceeds a predetermined threshold level, and switching means for applying the D.C. signal directly to the A.C. amplifier in response to the presence of said enable signal.

6. The gain control circuit of claim 5 wherein said detecting means is a differentiating circuit.

7. The gain control circuit of claim 5 wherein said control signal means comprises a one-shot multivibrator.

8. The gain control circuit of claim 5 including means for establishing a higher predetermined threshold level for said output signal when the amplifier circuit input signal exceeds the predetermined AGC threshold level than when it does not.

* * * * *

UNITED STATES PATENT OFFICE
CERTIFICATE OF CORRECTION

PATENT NO. : 4,024,463
DATED : May 17, 1977
INVENTOR(S) : Arlo D. Pelley

It is certified that error appears in the above-identified patent and that said Letters Patent are hereby corrected as shown below:

Column 2, line 19, delete "opertional" and substitute therefor --operational--;

column 2, line 30, delete "th" and substitute therefor --the--;

column 3, line 3, delete "ampliier" and substitute therefor --amplifier--;

column 3, line 18, delete "witout" and substitute therefor --without--; and column 3, line 48, delete "priod" and substitute therefor --period--.

Signed and Sealed this ninth Day of August 1977

[SEAL]

Attest:

RUTH C. MASON
Attesting Officer

C. MARSHALL DANN
Commissioner of Patents and Trademar